United States Patent
Okada et al.

(10) Patent No.: US 9,132,458 B2
(45) Date of Patent: Sep. 15, 2015

(54) PROCESSING MACHINE SYSTEM AND METHOD OF POSITIONING PROCESSING MACHINES

(71) Applicant: CANON KABUSHIKI KAISHA, Tokyo (JP)

(72) Inventors: Tetsuji Okada, Utsunomiya (JP); Keiji Emoto, Saitama (JP); Noriyasu Hasegawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 548 days.

(21) Appl. No.: 13/633,937

(22) Filed: Oct. 3, 2012

(65) Prior Publication Data

US 2013/0101382 A1    Apr. 25, 2013

(30) Foreign Application Priority Data

Oct. 25, 2011    (JP) .................................. 2011-234147

(51) Int. Cl.
*B21B 15/00*    (2006.01)
*B23Q 1/01*    (2006.01)
*B29C 35/08*    (2006.01)
(Continued)

(52) U.S. Cl.
CPC . *B21B 15/00* (2013.01); *B23Q 1/01* (2013.01); *B29C 35/08* (2013.01); *B29C 69/00* (2013.01); *F16F 15/00* (2013.01); *F16M 5/00* (2013.01);
(Continued)

(58) Field of Classification Search
CPC .......... B21B 15/00; B23Q 1/01; F16F 15/00; F16F 15/02; F16M 11/00; F16M 5/00
See application file for complete search history.

(56) References Cited

U.S. PATENT DOCUMENTS 4,425,980 A * 1/1984 Miles ............................ 181/208
4,660,799 A * 4/1987 Butland ........................ 248/676
(Continued)

FOREIGN PATENT DOCUMENTS

JP      5-234865 A    9/1993
JP   2000-018650 A    1/2000

OTHER PUBLICATIONS

Frangi, Andrea, et al. "Composite slab with integrated installation floor using cellular beams," Composite Construction in Steel and Concrete VI, Engineering Conferences International, Jul. 20-24, 2008.
(Continued)

*Primary Examiner* — Lee D Wilson
*Assistant Examiner* — Tyrone V Hall, Jr.
(74) *Attorney, Agent, or Firm* — Fitzpatrick, Cella, Harper & Scinto

(57) ABSTRACT

At least three processing machines are positioned on a supporting structure including a plurality of beams spaced apart from each other. The at least three processing machines include a first processing machine, a second processing machine supported by at least one of beams which support the first processing machine, and a third processing machine supported by beams different from all the beams which support the first processing machine. A distance between the first processing machine and the second processing machine, at which an amount of vibration transferred from the first processing machine to the second processing machine becomes smaller than a predetermined amount, is determined, thereby positioning the first processing machine and the second processing machine with a distance not less than the determined distance.

8 Claims, 6 Drawing Sheets

(51) Int. Cl.
*B29C 69/00* (2006.01)
*F16F 15/00* (2006.01)
*F16M 5/00* (2006.01)
*F16M 7/00* (2006.01)
*H01L 21/00* (2006.01)

(52) U.S. Cl.
CPC ............ *F16M 7/00* (2013.01); *H01L 21/00* (2013.01); *Y10T 29/51* (2015.01)

(56) References Cited

U.S. PATENT DOCUMENTS

| | | | |
|---|---|---|---|
| 4,989,826 A * | 2/1991 | Johnston, Jr. | 248/676 |
| 5,285,995 A * | 2/1994 | Gonzalez et al. | 248/550 |
| 5,308,675 A * | 5/1994 | Crane et al. | 428/120 |
| 5,504,407 A | 4/1996 | Wakui et al. | |
| 5,820,092 A * | 10/1998 | Thaler | 248/237 |
| 6,879,382 B2 | 4/2005 | Akutsu et al. | |
| 7,012,690 B2 | 3/2006 | Akutsu et al. | |
| 7,158,232 B2 | 1/2007 | Akutsu et al. | |
| 7,282,820 B2 | 10/2007 | Emoto | |
| 7,292,426 B2 | 11/2007 | Ito et al. | |
| 7,388,307 B2 | 6/2008 | Emoto | |
| 7,423,724 B2 | 9/2008 | Hasegawa et al. | |
| 7,466,531 B2 | 12/2008 | Ito et al. | |
| 7,508,646 B2 | 3/2009 | Emoto et al. | |
| 7,557,469 B2 | 7/2009 | Emoto | |
| 7,660,098 B2 | 2/2010 | Ito et al. | |
| 7,705,969 B2 | 4/2010 | Emoto | |
| 7,733,625 B2 | 6/2010 | Ito et al. | |
| 8,102,500 B2 | 1/2012 | Sato et al. | |
| 2008/0174057 A1 * | 7/2008 | Kim et al. | 267/140.11 |
| 2011/0023387 A1 * | 2/2011 | Sweeney et al. | 52/167.4 |
| 2012/0086931 A1 | 4/2012 | Sato et al. | |
| 2012/0193505 A1 * | 8/2012 | Baron | 248/636 |

OTHER PUBLICATIONS

Varela, Wendell D. And Ronaldo C. Barista. "Control of vibrations induced by people walking on large span composite floor decks," Engineering Structures, vol. 33, Issue 9, Sep. 20, 2011, pp. 2485-2494.

Taiwanese Office Action dated Oct. 22, 2014, issued in counterpart Taiwanese Patent Application No. 101138075, with an English translation.

Korean Office Action dated Jan. 21, 2015, issued in counterpart Korean Patent Application No. 10-2012-0115219.

* cited by examiner

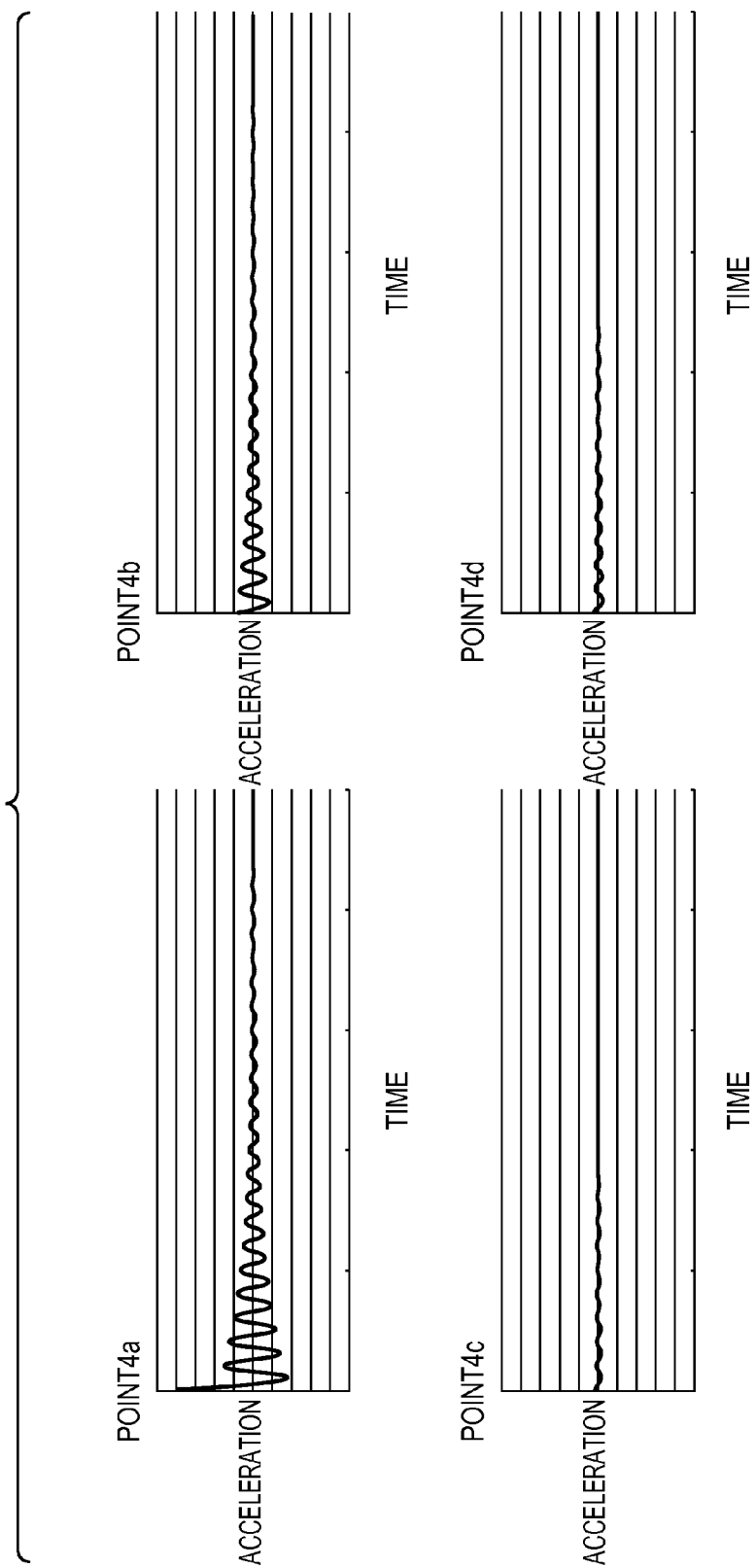

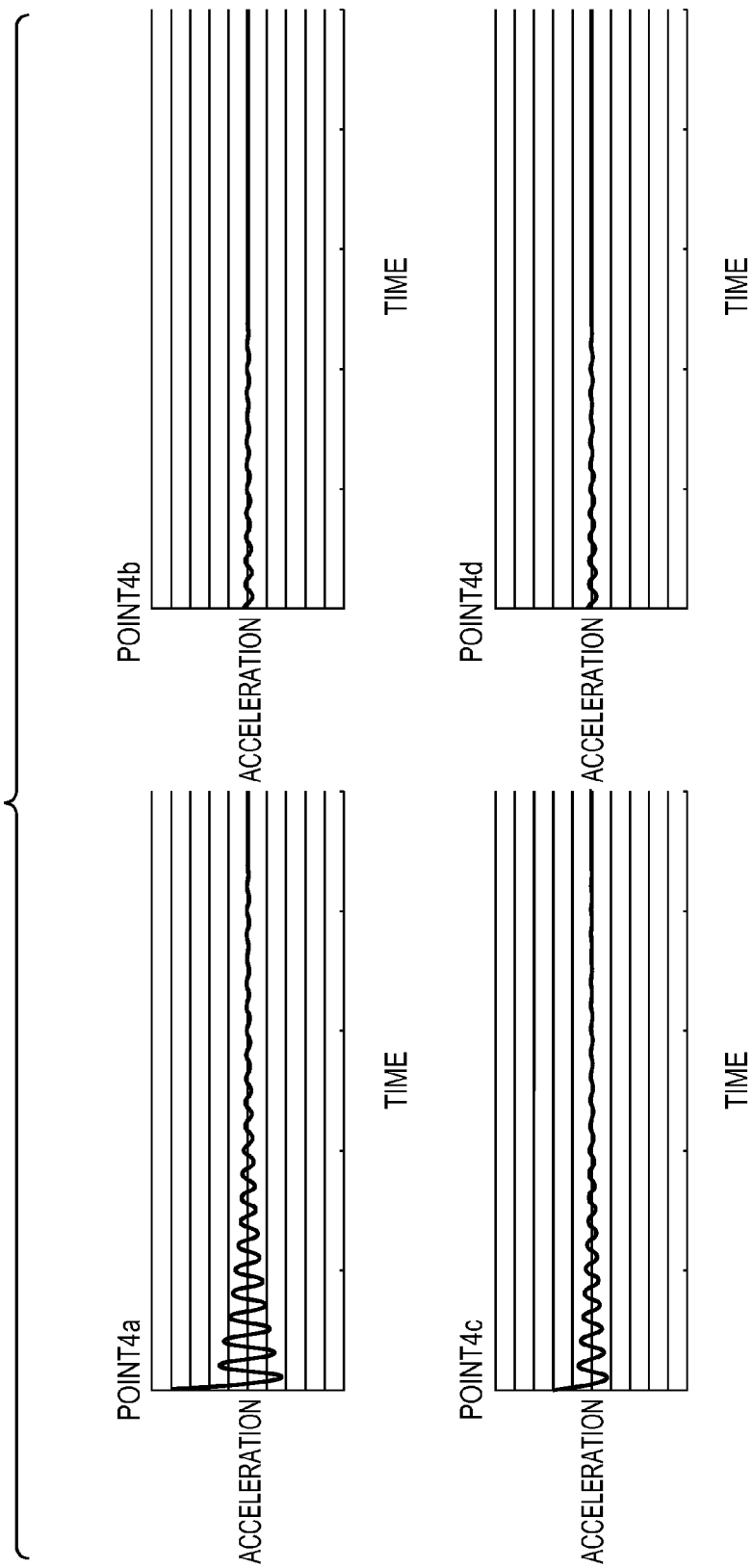

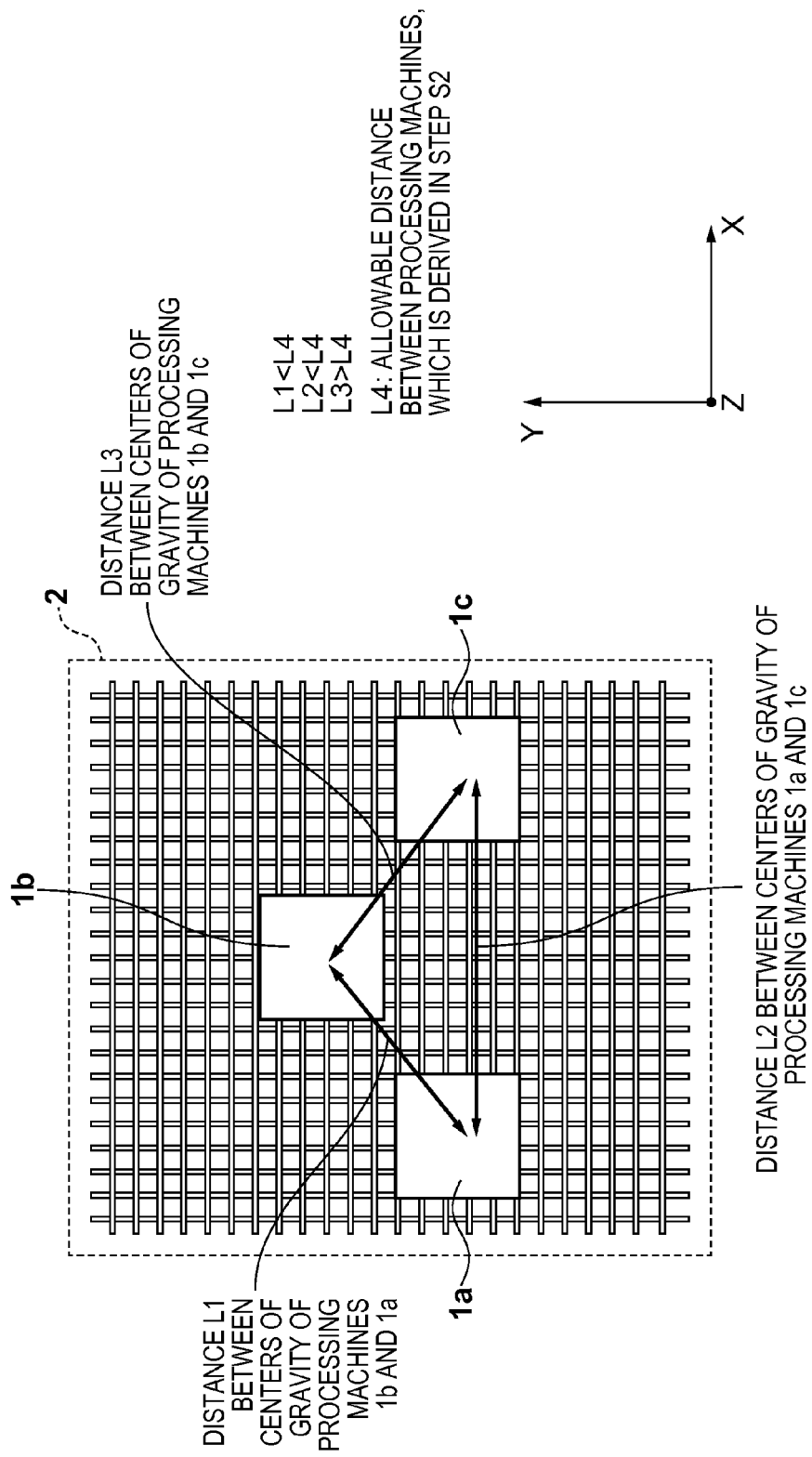

PROCESSING MACHINE SYSTEM AND METHOD OF POSITIONING PROCESSING MACHINES

BACKGROUND OF THE INVENTION

1. Field of the Invention

The present invention relates to a processing machine system and a method of positioning processing machines.

2. Description of the Related Art

In recent years, as a technique of manufacturing a semiconductor device, a fine patterning technique in which a mold is pressed against an uncured resin on a substrate to transfer a fine three-dimensional pattern formed on the mold onto the substrate is attracting a great deal of attention. This technique is called an imprint technique, which can form a fine structure on the order of several nanometers on a substrate. The photo-curing method, for example, is available as one of imprint techniques. In an imprint apparatus which adopts the photo-curing method, first, an ultraviolet-curing resin is coated (dispensed) on an imprint region on a substrate, and a mold is pressed against the resin. After the resin is cured upon irradiation with ultraviolet rays, the mold is released from the resin to form the pattern of the resin on the substrate.

An imprint apparatus is required not only to make the alignment error between a mold and a substrate fall within a tolerance on the order of several to several ten nanometers, but also to improve the transfer speed. In general, conventional exposure apparatuses such as a stepper and a scanner have a transfer speed and throughput higher than an imprint apparatus. To catch up with the throughput of the exposure apparatuses, a method of combining a plurality of imprint apparatuses into a cluster imprint system is available. In a cluster processing machine system, a plurality of processing machines are juxtaposed and manufacture devices, respectively, to ensure a given productivity and save space. Because cluster imprint systems especially use imprint apparatuses, each of which costs less than, for example, an immersion exposure apparatus, they offer an advantage in terms of cost as long as a large number of imprint apparatus can be arranged per unit area.

Unfortunately, juxtaposing processing machines often have a trade-off relationship with the transfer accuracy. That is, the vibration generated by one processing machine not only vibrates itself but will also vibrate other processing machines that are arranged around it through a supporting structure which supports the processing machine system. For example, during molding in which the mold is pressed against the uncured resin, the mold and the substrate maintain an accurate positional relationship in accordance with alignment conditions obtained in advance. However, when vibrational forces from other imprint apparatuses are transferred to a specific imprint apparatus, the interface at which the mold is in contact with the uncured resin becomes unstable, thus degrading the transfer accuracy. Japanese Patent Laid-Open No. 5-234865 discloses an apparatus which synchronously drives two stages so that reaction forces generated upon driving these stages cancel each other, in order to suppress vibration transfer between these stages through a base.

The apparatus disclosed in Japanese Patent Laid-Open No. 5-234865 employs a rigid body as a base which supports the stages, matches the times at which the stages start their acceleration/deceleration, and performs a synchronous operation so that the sum of the impulses of the times during which the stages accelerate/decelerate and the driving forces becomes zero. However, to set the sum of the impulses of the apparatuses to zero, it is necessary to take into consideration, for example, the number, positions, and rotational components of apparatuses, and the frequency components of generated vibrational forces, thus making it difficult to set the sum of the impulses to zero without adversely affecting other apparatuses. When a complex control system is provided to set the sum of the impulses to zero, it leads to an increase in cost.

As a method of suppressing vibration transfer between processing machines with no control system, a method of positioning a supporting structure so that vibrational forces generated by a plurality of processing machines do not adversely affect each other is available. However, simply setting large distances between the processing machines poses a problem resulting from a decrease in number of apparatuses arranged per unit area. A supporting structure which supports a plurality of processing machines is generally implemented by floor beams spaced apart from each other in two orthogonal directions. Each processing machine is placed on floor beams by fixing a pedestal provided in the processing machine to the floor beams. The bending rigidities of each floor beam are considerably different from each other in their longitudinal and widthwise directions, so the vibration transmission characteristics of this floor beam vary depending on the vibration direction, unlike a flat plate such as a base. Each beam has a low damping factor especially for vibration in the longitudinal direction, which is easily transferred. It is therefore desired to position processing machines in consideration of the vibration transmission characteristics of floor beams.

SUMMARY OF THE INVENTION

The present invention has been made in consideration of the above-mentioned situation, and provides a processing machine system which includes a plurality of processing machines and achieves both a reduction in space occupied by the processing machines and suppression of vibration transfer between the processing machines.

The present invention in its first aspect provides a method of positioning at least three processing machines on a supporting structure including a plurality of beams spaced apart from each other, the at least three processing machines including a first processing machine, a second processing machine supported by at least one of beams which support the first processing machine, and a third processing machine supported by beams different from all the beams which support the first processing machine, wherein a distance between the first processing machine and the second processing machine, at which an amount of vibration transferred from the first processing machine to the second processing machine becomes smaller than a predetermined amount, is determined, thereby positioning the first processing machine and the second processing machine with a distance not less than the determined distance.

Further features of the present invention will become apparent from the following description of exemplary embodiments with reference to the attached drawings.

BRIEF DESCRIPTION OF THE DRAWINGS

FIG. 3 shows graphs of the vibration transmission characteristics of the supporting structure;

FIG. 4 shows graphs of the vibration transmission characteristics of the supporting structure;

FIG. 5 is a view showing the processing machine system when viewed from a direction vertically above the supporting structure.

DESCRIPTION OF THE EMBODIMENTS

A cluster processing machine system including a plurality of processing machines according to an embodiment of the present invention will be described below with reference to the accompanying drawings. Note that the "cluster processing machine system" in this embodiment means a system including a plurality of processing machines which are juxtaposed on the same supporting structure and simultaneously manufacture articles such as devices, in order to ensure a given productivity and save space. The supporting structure according to the present invention means a floor which includes beams and to which processing machines are fixed through a pedestal provided in each processing machine.

Figure 1:
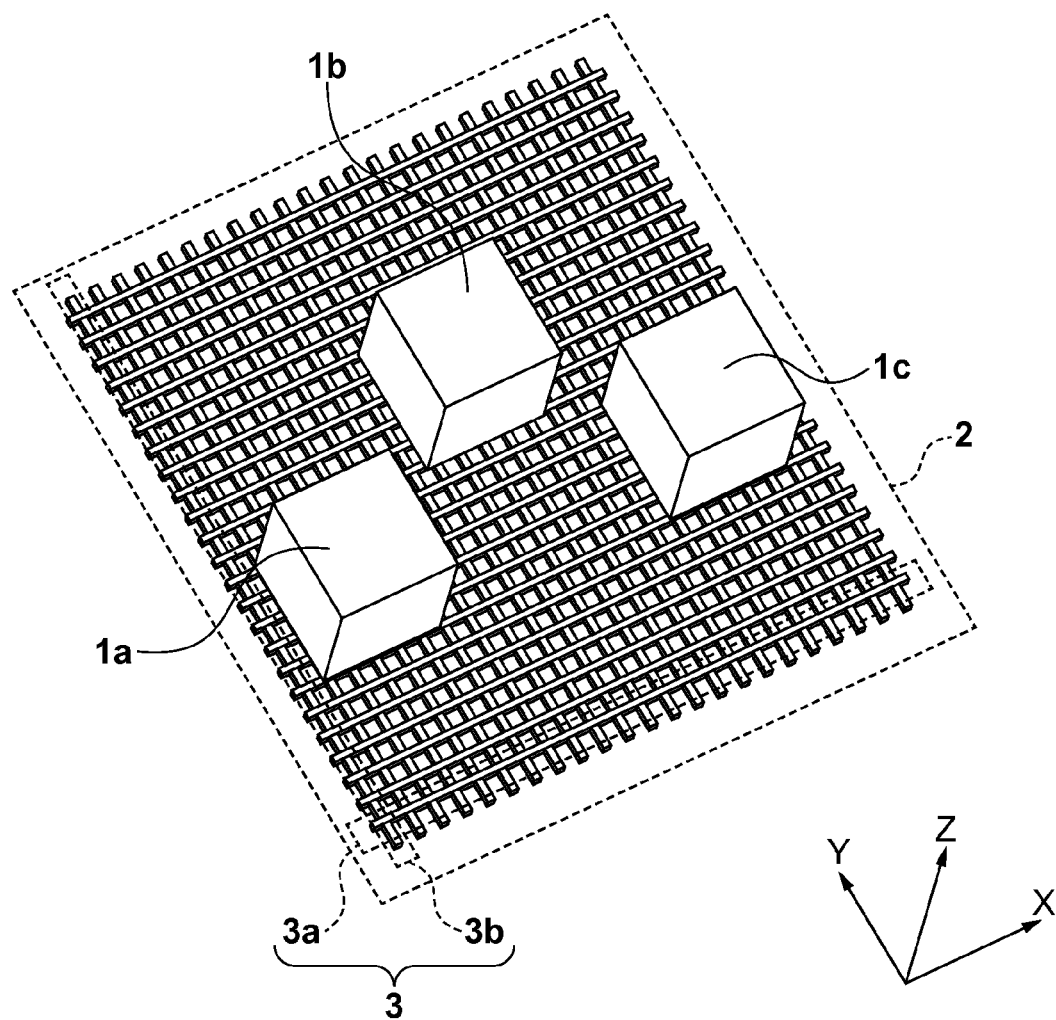
FIG. 1 is a schematic view showing a processing machine system.

FIG. 1 is a schematic view showing a processing machine system in this embodiment. The processing machine system includes three processing machines 1a, 1b, and 1c and a supporting structure 2 which supports them. Upon defining the first processing machine 1a as a first processing machine, the processing machine 1c is a second processing machine supported by at least one of beams which support the first processing machine 1a. Also, the processing machine 1b is a third processing machine supported by beams different from all the beams which support the first processing machine 1a. The three processing machines 1a, 1b, 1c will generically be referred to as processing machines 1 hereinafter. The supporting structure 2 is formed by first beams 3a and second beams 3b spaced apart from each other in two orthogonal directions (X- and Y-directions), like the floor beams of a general semiconductor device manufacturing plant. Referring to FIG. 1, the longitudinal direction of the first beams 3a is defined as the X-direction, the longitudinal direction of the second beams 3b is defined as the Y-direction, and a direction perpendicular to the plane of the supporting structure 2 is defined as the Z-direction. The X- and Y-directions serve as first and second directions which are parallel to the surface of the supporting structure 2 and orthogonal to each other. The first beams 3a and second beams 3b will generically be referred to as beams 3 hereinafter. At least three processing machines 1 are arranged on the supporting structure 2.

Figure 2A:
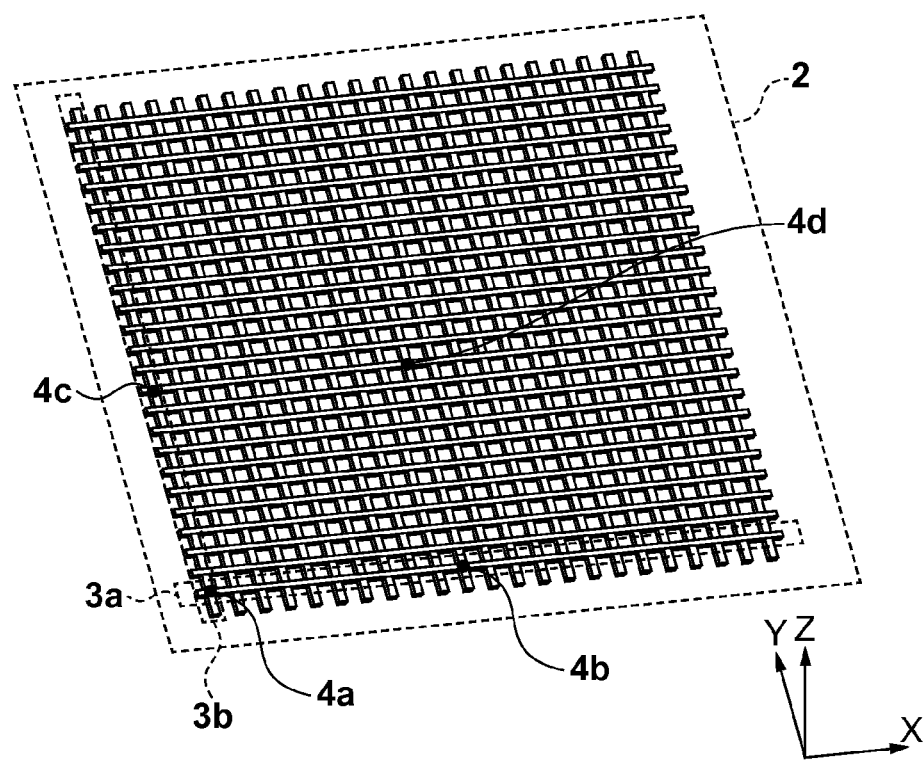
FIG. 2A is a schematic view showing a supporting structure.
Figure 2B:
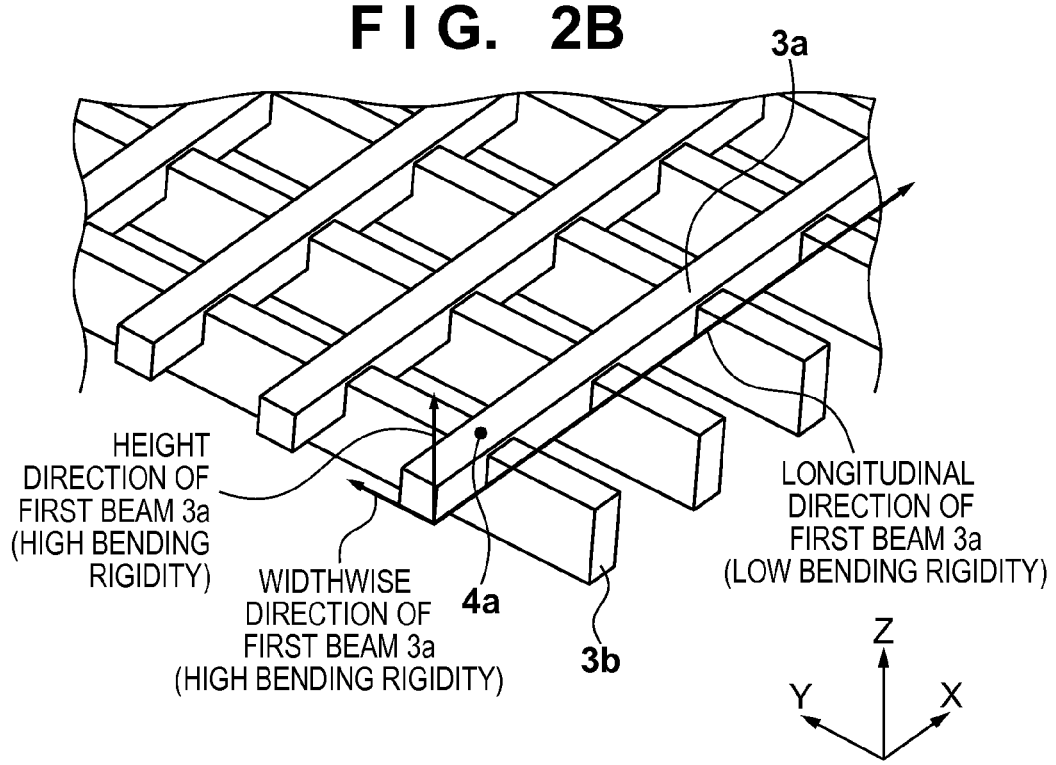
FIG. 2B is a partial enlarged view of the supporting structure.

FIG. 2A is a schematic view showing the supporting structure 2, and FIG. 2B is a partial enlarged view of the supporting structure 2. As shown in FIG. 2B, the bending rigidity of the beam 3 is lower in the longitudinal direction than in the widthwise and height directions, like a general beam. The supporting structure 2 formed by the beams 3 as shown in FIGS. 2A and 2B has a characteristic feature that its vibration transmissibility in a direction perpendicular to the longitudinal direction is low, but its vibration transmissibility in the longitudinal direction is high. Hence, as shown in FIG. 1, if the processing machines 1a and 1c are positioned so that they are partially supported by the same beams 3, when one processing machine 1a vibrates the supporting structure 2 in the longitudinal direction (X-direction) of the first beams 3a, the vibration is easily transferred to the other processing machine 1c through the supporting structure 2. On the other hand, if the processing machines 1a and 1b are positioned so that they are supported by beams 3 different in both the X- and Y-directions, vibration generated by one processing machine 1a is hardly transferred to the other processing machine 1b through the supporting structure 2 regardless of the directions of vibrational forces generated by the processing machines 1a and 1b.

FIG. 3 illustrates an example of the accelerations of points 4a to 4d in the X-direction when the point 4a shown in FIG. 2A is vibrated in the X-direction. The point 4b has a high vibration transmissibility because it is positioned in the X-direction that coincides with the vibration direction relative to the point 4a, while the points 4c and 4d have low vibration transmissibilities because they are positioned in the Y-direction perpendicular to the vibration direction relative to the points 4a and 4b, respectively. Also, FIG. 4 illustrates an example of the accelerations of the points 4a to 4d in the Y-direction when the point 4a shown in FIG. 2A is vibrated in the Y-direction. The point 4c has a high vibration transmissibility because it is positioned in the Y-direction that coincides with the vibration direction relative to the point 4a, while the points 4b and 4d have low vibration transmissibilities because they are positioned in the X-direction perpendicular to the vibration direction relative to the points 4a and 4c, respectively. As can be seen from the foregoing description, vibration is hardly transferred to the point 4d which does not share any beam 3 with the point 4a, regardless of the direction in which the point 4a is vibrated.

Figure 6:
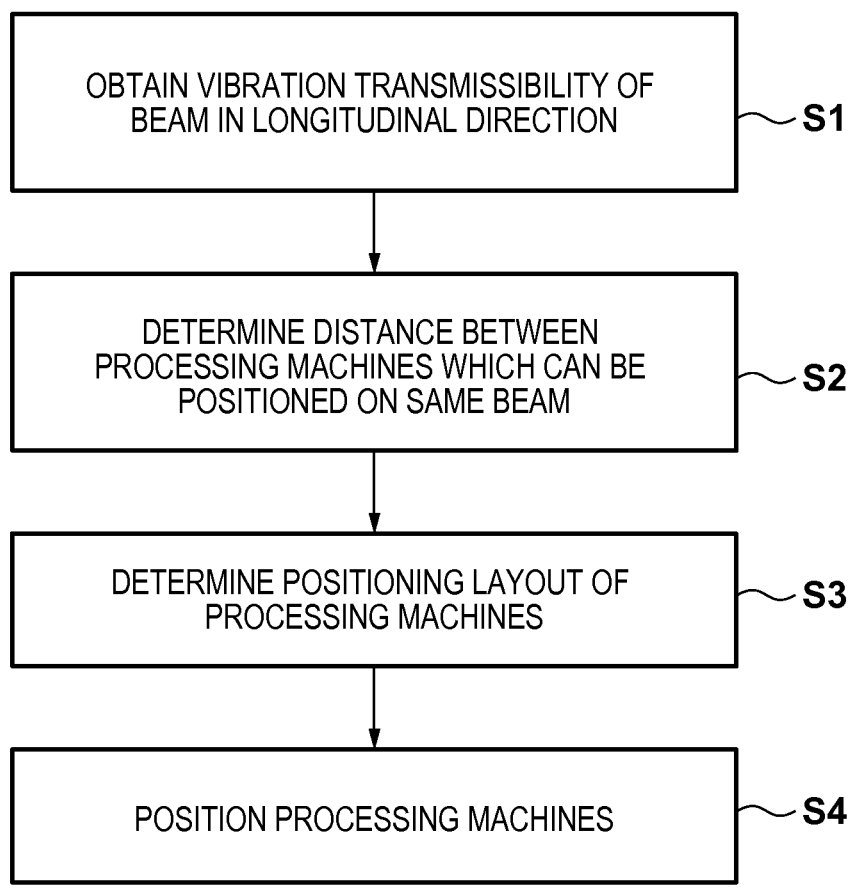
FIG. 6 is a flowchart showing the procedure of a method of positioning processing machines.

Hence, in this embodiment, processing machines are positioned in a processing machine system in accordance with a procedure shown in FIG. 6. In step S1, the vibration transmissibility, in the longitudinal direction, of the beam 3 which forms the supporting structure 2 is obtained. The vibration transmissibility can be obtained by positioning a measuring device on the beam 3 of the supporting structure 2, and performing actual measurement based on the vibration result. When the processing machine is, for example, an imprint apparatus or an exposure apparatus, the vibration transmissibility is measured while a substrate stage which holds a substrate accelerates at a maximum acceleration. The vibration transmissibility may be calculated by simulation assuming the supporting structure 2.

In step S2, the distance (allowable distance) between the processing machines, at which the amount of vibration transferred through the beams 3 when the processing machines 1 are supported by the same beams 3 is smaller than a predetermined amount, is determined based on the vibration transmissibility obtained in step S1, the vibrational forces that the processing machines 1 apply on the supporting structure 2, and the amount of vibration allowable for the processing machines 1. The distance between the processing machines is, for example, the distance between the centers of gravity of the processing machines 1. In a mode (first mode) in which a plurality of processing machines 1 are positioned on the same beams 3, the distance between two processing machines adjacent in the longitudinal direction of the same beams 3 is set equal to or larger than the allowable distance obtained in step S2. In a mode (second mode) in which a plurality of processing machines 1 are positioned so that they are supported by different beams 3, the constraint that the distance between the processing machines is set equal to or larger than the allowable distance obtained in step S2 is not imposed.

In step S3, if the number of processing machines 1 to be arranged is set in advance, the first and second modes are combined to determine the positioning layout of processing machines 1 so as to minimize the area occupied by a predetermined number of processing machines 1. However, if the area occupied by processing machines 1 is set in advance, the first and second modes are combined to determine the positioning layout of processing machines 1 so as to maximize the number of processing machines 1 arranged in a predetermined area. In step S4, a plurality of processing machines 1 are positioned on the supporting structure 2 in accordance with the positioning layout of processing machines 1 determined in step S3.

FIG. 5 shows the positioning layout of three processing machines 1a to 1c when viewed from a direction vertically above the supporting structure 2, which is determined in accordance with the procedure shown in FIG. 6. Since the processing machine 1b is positioned on beams 3 different from beams 3 which support the processing machines 1a and 1c, it can be spaced apart from the processing machines 1a and 1c by a distance shorter than the allowable distance obtained between the processing machines 1a and 1c in step S2. On the other hand, since the processing machines 1a and 1c are positioned on the same beams 3, they are spaced apart from each other by a distance longer than the allowable distance obtained in step S2.

In this embodiment, a plurality of processing machines 1 are positioned by combining the first mode in which they are supported by the same beams 3, and the second mode in which they are supported by different beams 3 so as to reduce their distance. This makes it possible to achieve both suppression of vibration transfer between the processing machines and a reduction in space occupied by the processing machines. The processing machine 1 which constitutes the processing machine system in the present invention serves as, for example, a lithography apparatus which forms a pattern on a photosensitive material coated on a substrate, and has a required processing accuracy on the order of several to several ten nanometers and a small allowable value for floor vibration. A lithography apparatus to which the present invention is applicable includes an imprint apparatus which cures a resin, coated on a substrate, as a mold is brought into contact with the resin, thereby forming a pattern on the resin, an exposure apparatus which exposes a substrate to light, and a drawing apparatus which performs drawing on a substrate with a charged-particle beam.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-234147 filed Oct. 25, 2011, which is hereby incorporated by reference herein in its entirety.

What is claimed is:

1. A method of positioning at least three processing machines on a supporting structure including a plurality of beams spaced apart from each other,
the at least three processing machines including a first processing machine, a second processing machine supported by at least one of beams which support the first processing machine, and a third processing machine supported by beams different from all the beams which support the first processing machine,
wherein a distance between the first processing machine and the second processing machine, at which an amount of vibration transferred from the first processing machine to the second processing machine becomes smaller than a predetermined amount, is determined, thereby positioning the first processing machine and the second processing machine with a distance not less than the determined distance.

2. The method according to claim 1, wherein a distance between the third processing machine and the first processing machine is smaller than the distance between the second processing machine and the first processing machine.

3. The method according to claim 1, wherein the plurality of beams include a plurality of first beams and a plurality of second beams which extend in a first direction and a second direction, respectively, that are parallel to a surface of the supporting structure and orthogonal to each other.

4. The method according to claim 1, wherein each of the at least three processing machines serves as one of an imprint apparatus configured to bring a resin, coated on a substrate, into contact with a mold and cure the resin, thereby forming a pattern on the resin, an exposure apparatus configured to expose a substrate to light, and a drawing apparatus configured to perform drawing on a substrate with a charged-particle beam.

5. A processing machine system formed by positioning at least three processing machines on a supporting structure including a plurality of beams spaced apart from each other,
the at least three processing machines including a first processing machine, a second processing machine supported by at least one of beams which support the first processing machine, and a third processing machine supported by beams different from all the beams which support the first processing machine.

6. The system according to claim 5, wherein a distance between the third processing machine and the first processing machine is smaller than a distance between the second processing machine and the first processing machine.

7. The system according to claim 5, wherein the plurality of beams include a plurality of first beams and a plurality of second beams which extend in a first direction and a second direction, respectively, that are parallel to a surface of the supporting structure and orthogonal to each other.

8. The system according to claim 5, wherein each of the at least three processing machines serves as one of an imprint apparatus configured to bring a resin, coated on a substrate, into contact with a mold and cure the resin, thereby forming a pattern on the resin, an exposure apparatus configured to expose a substrate to light, and a drawing apparatus configured to perform drawing on a substrate with a charged-particle beam.

* * * * *